United States Patent [19]

Kubach et al.

[11] Patent Number: 4,639,822

[45] Date of Patent: Jan. 27, 1987

[54] ARRANGEMENT FOR RAPID SWITCHING OF AN ELECTROMAGNETIC LOAD

[75] Inventors: Hans Kubach, Korntal-Münchingen; Hartmann Rupp, Ludwigsburg, both of Fed. Rep. of Germany

[73] Assignee: Robert Bosch GmbH, Stuttgart, Fed. Rep. of Germany

[21] Appl. No.: 770,646

[22] Filed: Aug. 28, 1985

[30] Foreign Application Priority Data

Nov. 23, 1984 [DE] Fed. Rep. of Germany ....... 3442764

[51] Int. Cl.$^4$ ............................................. H01H 47/32
[52] U.S. Cl. ...................................... 361/155; 123/490
[58] Field of Search ............... 361/155, 156, 186, 190, 361/153; 123/490

[56] References Cited

U.S. PATENT DOCUMENTS

| | | | |
|---|---|---|---|
| 4,225,898 | 9/1980 | Weber et al. | 123/490 X |
| 4,234,903 | 11/1980 | Harper | 123/490 X |
| 4,323,944 | 4/1982 | Hill | 361/156 X |
| 4,360,855 | 11/1982 | Ohba | 123/490 X |
| 4,377,144 | 3/1983 | Takahashi | 123/490 |
| 4,452,210 | 6/1984 | Sasayama et al. | 123/490 |
| 4,473,861 | 9/1984 | Kosak et al. | 361/152 |
| 4,511,945 | 4/1985 | Nielsen | 123/490 X |
| 4,533,972 | 8/1985 | Ohashi | 361/156 |

Primary Examiner—Michael L. Gellner
Attorney, Agent, or Firm—Michael J. Striker

[57] ABSTRACT

An arrangement for rapid switching of an electromagnetic load includes a series arrangement of a switching device with the electromagnetic load, a relief diode arranged in parallel with the electromagnetic load, and a capacitor arranged in parallel to the switching means. Another switching device is arranged parallel to the capacitor and controls the operation of the latter, while an additional switching device is arranged in series with the relief diode and controls the operation of such relief diode. An operating arrangement for controlling the various switching devices issues various control signals at least some of which depend on electric signals derived from the switching arrangement. During the operation of the switching arrangement, the operating arrangement selectively makes the various switching devices conductive and non-conductive in a predetermined sequence to enhance the speed of switching of the electromagnetic load between its two end states. The switching arrangement is especially suited for use in the fuel metering in internal combustion engines with the aid of magnetically operated valves.

14 Claims, 7 Drawing Figures

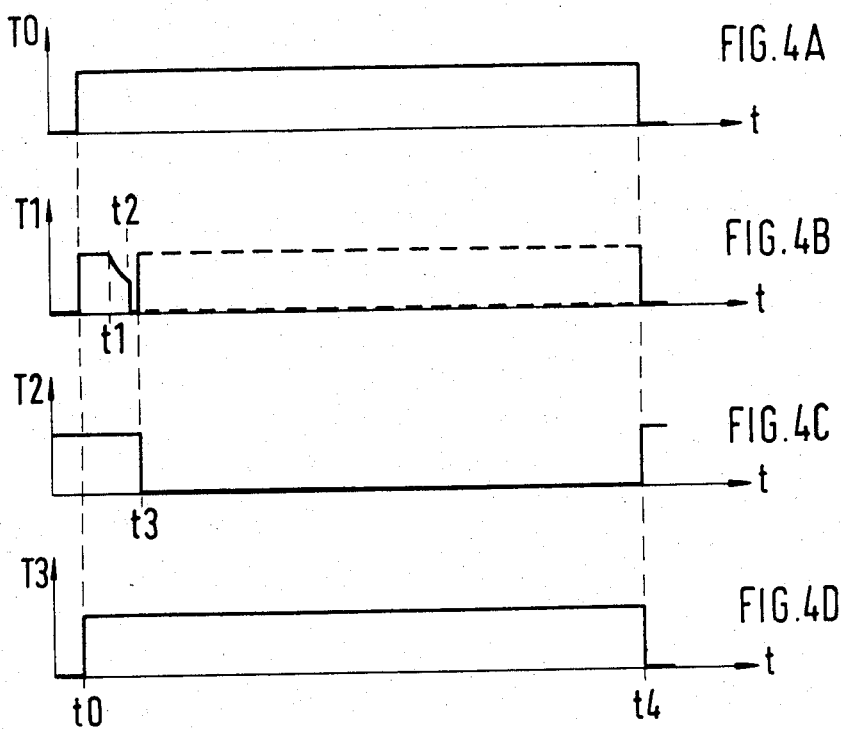

ARRANGEMENT FOR RAPID SWITCHING OF AN ELECTROMAGNETIC LOAD

BACKGROUND OF THE INVENTION

The present invention relates to arrangements for switching electromagnetic loads in general, and more particularly to an arrangement for rapid switching of electromagnetic loads usable especially in the fuel delivery and metering, electromagnetically operated, valves of a fuel injection device of an internal combustion engine.

There are already known various constructions of switching arrangements of this type. Such switching arrangements include at least a series arrangement of the electromagnetic load with a switching transistor and a measuring resistor. For the reliable operation of such a switching arrangement, it is, for example, necessary to arrange a relief diode, which may be so arranged that it can be switched on and off, in parallel to the electromagentic load. It is also known to influence the switching transistor and, in certain instances, the transistor which controls the relief diode, at least in dependence on the voltage applied to the measuring resistor.

However, the known arrangements of this type have the disadvantage that the switching-on and switching-off times of the electromagnetic load are relatively long. Additional disadvantages of such arrangements are that relatively high energy losses temporarily occur in the switching arrangement, as well as that the arrangements of this type can only under certain limited conditions be used for the construction of a timing control circuit.

SUMMARY OF THE INVENTION

Accordingly, it is a general object of the present invention to avoid the disadvantages of the prior art.

More particularly, it is an object of the present invention to provide a switching arrangement for an electromagnetic load, which does not possess the drawbacks of the known arrangements of this type.

Still another object of the present invention is so to construct the arrangement of the type here under consideration as to achieve very rapid switching of the electromagnetic load between its two end states or positions.

It is yet another object of the present invention so to design the arrangement of the above type as to keep energy losses to a minimum.

An additional object of the present invention is to devise a switching arrangement which is particularly suited for use in fuel injection systems of internal combustion engines, especially such incorporating magnetically operated valves.

A concomitant object of the present invention is to develop a switching arrangement of the above type which is relatively simple in construction, inexpensive to manufacture, easy to use, and reliable in operation nevertheless.

In pursuance of these objects and others which will become apparent hereafter, one feature of the present invention resides in a switching arrangement for an electromagnetic load, which comprises switching means arranged in series with the electromagnetic load; and controllable capacitor means arranged in parallel with the switching means. The switching arrangement constructed in this manner has the advantages as compared to known switching arrangements that short switching times of the electromagnetic load, low energy losses within the switching arrangement, and the construction of a timing control circuit can be realized by utilizing the same.

It is particularly advantageous when, in accordance with an aspect of the present invention, there is further provided means for controlling the capacitor means, such controlling means including a diode arranged in series with the capacitor means. Instead of, but preferably in addition to, the diode, there may further advantageously be provided additional switching means arranged in series with the capacitor means. When both the diode and the additional switching means is used, it is advantageous when they are arranged in series with the capacitor means and in parallel to one another.

In accordance with another facet of the present invention, the switching arrangement further comrises, in addition to the switching means that is arranged in series with the electromagnetic load, additional switching means, and means for operating all of such switching means. Then, the operating means is operative for rendering only the first-mentioned switching means conductive during an initial period of operation of the switching arrangement. Such operating means is further operative for rendering all of the switching means non-conductive during a second period of operation that follows the initial period. The operating means is also operative for causing the first-mentioned switching means to alternatingly switch between its conductive and non-conductive states during a third period of operation that follows the second period. Advantageously, the additional switching means includes a switching device arranged in series with the capacitor means; then, the operating means is operative for rendering only the switching device conductive during a fourth period of operation that follows the third period. It is further advantageous when the switching arrangement also includes a relief diode for the electromagnetic load, such relief diode being arranged to conduct no current during the second period of operation. To this end, the additional switching means may further include an additional switching device arranged in series with the relief diode and influencing the operation of the latter.

It is particularly advantageous, but not indispensable, for the first-mentioned switching means to be operative for at least temporarily limiting the current flowing through the electromagnetic load during the initial period of operation of the switching arrangement. The current-limiting action of the first-mentioned switching means influences the magnetic saturation of the electromagnetic load; then, there is further provided means for detecting the end of the initial period of operation on the basis of such current-limiting action.

The novel features which are considered as characteristic of the invention are set forth in particular in the appended claims. The improved switching arrangement itself, however, both as to its construction and its mode of operation, together with additional features and advantages thereof, will be best understood upon perusal of the following detailed description of certain specific embodiments with reference to the accompanying drawing.

BRIEF DESCRIPTION OF THE DRAWING

FIGS. 4a to 4d are diagrammatic representations of the various control signals that control the operation of the switching arrangement of FIG. 1, during operation with current limitation according to FIG. 2.

DETAILED DESCRIPTION OF THE PREFERRED EMBODIMENTS

Figure 1:
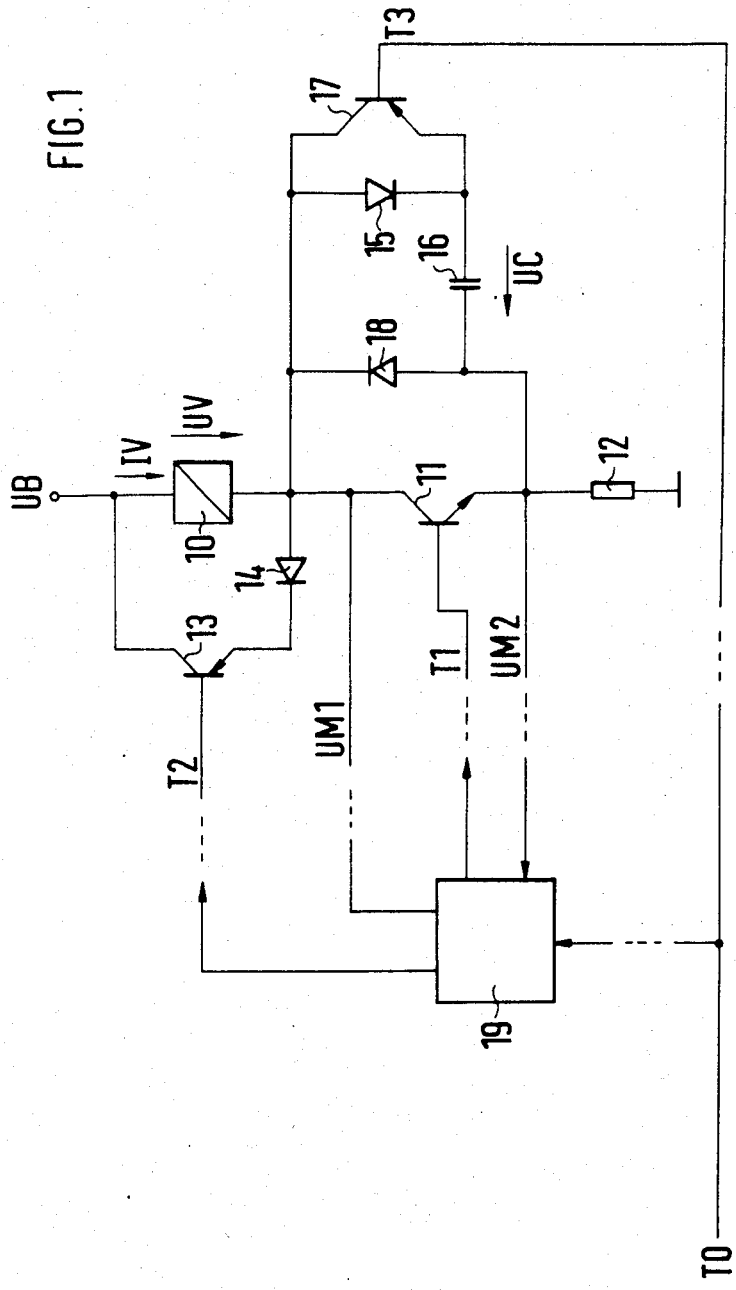
FIG. 1 is a circuit diagram showing a possible realization of the switching arrangement of the present invention.

Referring now to the drawing in detail, and first to FIG. 1 thereof, it is to be mentioned initially that it depicts a switching arrangement for rapid switching of electromagnetic loads. In principle, the switching arrangement described here is usable in conjunction with electromagnetic loads of any kind whatsoever, that is, it is not limited to any special use thereof. However, it is especially advantageous when the switching arrangement of the present invention is employed in connection with internal combustion engines, especially in the metered supply of fuel into the combustion chamber of the internal combustion engine. To this end, a magnetically operated valve can be used in a particularly advantageous manner for the injection of the fuel into the internal combustion engine.

FIG. 1 illustrates a possible realization of the switching arrangement according to the present invention. As shown in this Figure, a magnetically operated valve 10, a switching transistor 11 and a measuring resistor 12 are arranged in series between the battery voltage UB and the ground. Herein, the current that flows through the magnetically operated valve 10 is denoted by IV, while the voltage effective at the magnetically operated valve 10 is indicated by UV. Parallel to the magnetically operated valve 10, there is arranged a series circuit incorporating a relief diode 14 and a relief transistor 13, this series relief circuit extending between the junctures of the magnetically operated valve 10 with the switching transistor 11 and with the battery voltage UB. A control signal T2 is applied to the base of the relief transistor 13. A parallel control circuit of a control diode 15 and a control transistor 17 extends between the juncture of the magnetically operated valve 10 with the switching transistor 11 and one terminal of a control capacitor 16. The other terminal of the control capacitor 16 is connected to the juncture of the switching transistor 11 with the measuring resistor 12. The voltage that is effective at the control capacitor 16 is identified as UC. The base of the control transistor 17 is supplied with a control signal T3. Furthermore, an additional diode 18 is arranged in parallel to the switching transistor 11. The switching transistor 11 is controlled by a control signal T1. The voltage which exists at the juncture of the magnetically operated valve 10 with the switching transistor is denoted as UM1, while the voltage which exists at the juncture of the switching transistor 11 and the measuring resistor 12 is identified by UM2. The reference numeral 19 has been used to identify a control or regulating arrangement. This control or regulating arrangement 19 is an electronic circuit that is operative for processing incoming data and issuing control signals based on such data. To this end, the control or regulating arrangement 19 receives at least the voltage signals UM1 and UM2, as well as a ground control signal T0, and processes the same in a manner which will become apparent hereafter to provide at least one output signal but advantageously several output signals in dependence on these input signals UM1, UM2 and T0, such output signal or signals then being used to either directly or even indirectly control the operation of the transistors 11, 13 and 17. The operation of the control or regulating arrangement 19 will become apparent hereafter, so that it is not necessary to describe its circuitry here since the latter follows from the former; suffice it to say that the control or regulating arrangement 19 may be constituted by a microcomputer that operates on the input signals UM1, UM2 and T0 and issues the requisite output signal or signals at appropriate times.

Figure 2:
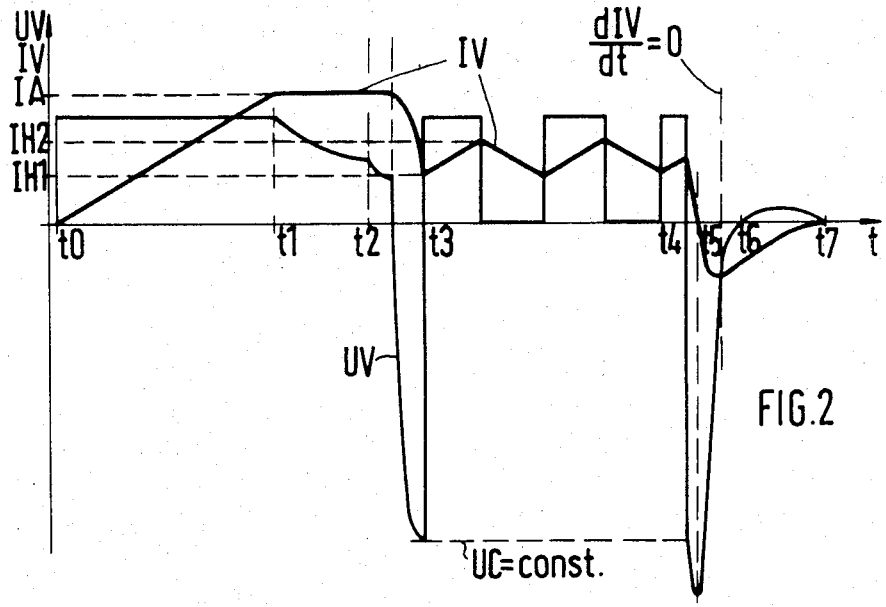
FIG. 2 is a diagrammatic representation of the dependences of the various voltages and currents encountered in the switching arrangement of FIG. 1 on time, with current limitation.
Figure 3:
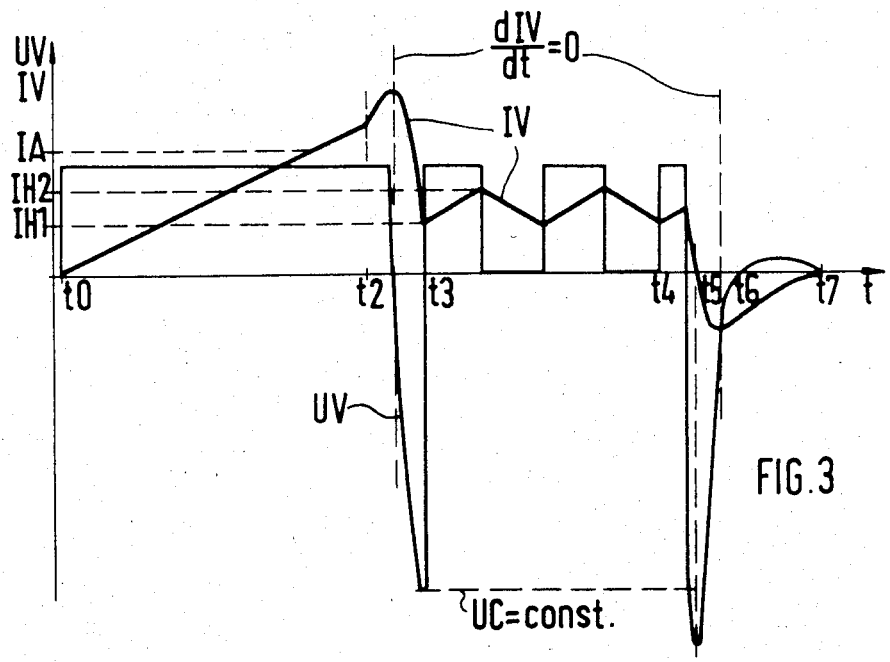
FIG. 3 is a diagrammatic representation similar to that of FIG. 2, but without current limitation.

Having so described the construction of the switching arrangement of the present invention as depicted in FIG. 1 of the drawing, the operation of the switching arrangement will now be discussed with reference to FIGS. 2 and 3, as well as 4a to 4d, of the drawing. FIGS. 2 and 3 are graphic representations of voltage and current characteristics of the switching arrangement with and without current limitation, respectively. In both of these Figures, the valve voltage UV, as well as the valve current IV, is depicted as a function of time. In both of these FIGS. 2 and 3, IA denotes the so-called starting current, that is, the current which is required for the magnetic attraction of the movable part of the magnetically operated valve 10, that is, for the transfer of such movable part of the magnetically operated valve 10 from its rest position into its other end position. IH1 and IH2 denote two holding currents which constitute respective upper and lower current thresholds for the control of the flow of electric current through the magnetically operated valve 10. The lower threshold, that is, the holding current IH1, must be so selected that at this current level the movable part of the magnetically operated valve 10 securely remains in its then assumed position or state.

Certain characteristic instants of time of operation of the switching arrangement of the present invention are identified in FIGS. 2 and 3 by the notations t0 to t7. At the time instant t0, the control of the operation of the magnetically operated valve 10 is commenced. Starting with the time instant t1, the current IV flowing through the magnetically operated valve 10 is limited in FIG. 2. The time instant t2 corresponds to the so-called valve abutment, that is, the complete transfer of the movable part of the magnetically operated valve 10 from its rest position into its other end position. Commencing at the time instant t3, the magnetically operated valve is operated in a cyclic fashion in that the valve current IV is caused to increase and decrease regularly. The time instant t4 characterizes the end of the control of the magnetically operated valve 10. At the time instant t5, the current IV through the magnetically operated valve 10 goes through zero, while at the time instant t6 the voltage UV applied to the magnetically operated valve 10 undergoes a corresponding zero passage. At the time instant t7, the valve current IV, as well as the valve voltage UV, have again become zero.

FIGS. 4a to 4d depict, in a diagrammatic fashion, the dependence of the various control signals T0 to to T3 on time when current limiting is in effect. Herein, FIG. 4a illustrates the time dependence of the ground control signal T0 for the magnetically operated valve 10, FIG. 4b that of the control signal T1 for the switching transistor 11, FIG. 4c that of the control signal T2 for the relief transistor 13, and FIG. 4d that of the control signal T3 for the control transistor 17. The indications for the time instant t0 to t4 correspond to the indications t0 to t4 as shown in FIGS. 2 and 3. In the graphic representations of FIGS. 4a to 4d, various voltages of the respective control signals T0 to T3 are presented as functions of time. These voltages of the signals T0 to T4 are those that are applied to the magnetically operated valve 10 and to the bases of the respective transistors 11, 13 and 17. Herein, the voltages T0 to T3 are not necessarily drawn to any particular scale Now, during the control of the operation of the switching arrangement of the present invention, commencing at a time preceding the time instant t0 and considering the ground control signal T0 to be at the ground level, the result is that, because of the values of the control signals T1, T2 and T3 as depicted in FIGS. 4b to 4d, the switching transistor 11 and the relief transistor 13 are non-conductive, while the control transistor 17 is conductive. The current IV through the magnetically operated valve 10 prior to the time instant t0 equals zero. At the time instant t0, the ground control signal T0 jumps from the ground level to a high potential level, since the movable part of the magnetically operated valve 10 is supposed to move as quickly as possible from its rest position or state to its other end position or state at this time. To this end, the control signal T1 and the control signal T3 are so changed at the same time t0 that the switching transitor 11 switches into its conductive state, while the relief transistor 17 switches into its non-conductive state. As a result of this, the valve voltage UV abruptly increases to a high value, usually to the value of the battery voltage UB, and the valve current IV begins to gradually increase.

At the time instant t1, as depicted in FIG. 2, the valve current IV exceeds at least the value of the of the current needed for the valve abutment, this value being identified by IA. At this time, there exist two alternatives, namely that depicted in FIG. 2 which involves current limitation, and that shown in FIG. 3 which does not involve any current limitation.

According to FIG. 2, the valve current IV is so controlled, commencing with the time instant t1, that it maintains the value of the requisite abutment current IA or a slightly higher value. This is achieved in that, due to the value of the control signal T1 as shown in FIG. 4b, the voltage UV supplied to the magnetically operated valve 10 is reduced. On the other hand, no current limitation is accomplished in accordance with FIG. 3, that is the current IV is not limited to the value of the abutment current IA or the aforementioned slightly higher value. Consequently, in this case the current IV gradually increases, and the voltage UV remains constant.

In both instances, the movable part of the magnetically operated valve 10 has reached its other end position or state at the time instant t2. This can be recognized in FIG. 2, for instance, by the fact that the characteristic curve of the voltage UV supplied to the magnetically operated valve 10 exhibits a sharp bend at this valve abutment time instant t2. An analogous sharp bend in the characteristic curve of the current IV flowing through the magnetically operated valve 10 characterizes the occurrence of such valve abutment in FIG. 3. As shown in FIG. 4b, in both instances, that is with or without current limitation, the switching transistor 11 is made non-conductive by the control signal T1 after the recognition of the time instant t2. Accordingly, at this time, all three transistors 11, 13 and 17 are in their non-conductive states. While the current IV was able to flow through the magnetically operated valve 10, the open switching transistor 11 and the measuring resistor 12 prior to the time instant t2, now, after the recognition of the time instant t2 and thus after the switching of the switching transistor 11 into its non-conductive state, the current IV has only the possibility of flowing through the magnetically operated valve 10, the diode 15, the capacitor 16, and the measuring transistor 12, and thus to charge the capacitor 16. As can be ascertained from FIGS. 2 and 3, this charging of the capacitance 16 results in a negative voltage UV at the magnetically operated valve 10 and a rapidly diminishing current IV through the magnetically operated valve 10. What is important in this respect is that the value of the voltage at the control capacitor 16, which is designated UC, is considerably larger than the value of the battery voltage UB, typically by a factor of 10, for example.

As already explained above, after the switch-over, that is, after the time instant t2, the current IV through the magnetically operated valve 10 diminishes. Now, at the time instant t3, the current IV reaches the value of the threshold holding current IH1. As shown in the two diagrammatic representations of FIGS. 4b and 4c, the switching transistor 11 and the relief transistor 13 are switched into their conductive states at this time instant t3. This results in a situation where the current IV flowing through the magnetically operated valve 10 increases again. When the current IV then reaches the value of the threshold holding current IH2, the switching transistor 11 is again switched off, that is, transferred into its non-conductive state, as a result of which the value of the current IV is again reduced. Thus, when the switching transistor 11 is in its conductive state, the current IV flows through the magnetically operated valve 10, the switching transistor 11 and the measuring resitor 12, while the current IV flows from the magentically operated valve 10 through the diode 14 and the relief transistor 13 when the switching transistor 11 is in its non-conductive state. As shown in both FIGS. 2 and 3, the voltage UV applied to the magnetically operated valve 10 is at a positive value when the switching transistor 11 is conductive, while it is at zero when the switching transistor 11 is non-conductive.

The control of the current IV flowing through the magnetically operated valve 10 toward greater and lesser values, that is, the cycling of the valve current IV, is continued up to the time instant t4. The cycling of the valve current IV in the time interval between the time instants t3 and t4 is accomplished solely and exclusively by the switching of the switching transistor 11 between its conductive and non-conductive states. The relief transistor 13 is maintained in its conductive state during this entire time interval, and the control transistor 17 remains in its non-conductive state.

The time instant t4 signifies the end of the control of the magnetically operated valve 10 as far as the displacement of its movable part into its other end position or state and maintenance in such position or state is concerned. This means that the movable part of the magnetically operated valve 10 is to be returned as quickly as possible into its original rest position or state. This is achieved in that the ground control signal T0 is again rapidly changed to the ground value at the time instant t4, as shown in FIG. 4a and, as shown in FIGS. 4b to 4d, the switching transistor 11 and the relief transistor 13 are switched by the respective signals T1 and T2 into their non-conductive states, while the control transistor 17 is brought by the control signal T3 into its conductive state. Hence, while the current IV flowed previously, that is, between the time instants t3 and t4, either through the elements 10, 11 and 12, or through the elements 10, 14 and 13, now, after the time instant t4, these flow paths are no longer available because of the non-conductive states of the transistors 11 and 13. Inasmuch as the current IV through the magnetically operated valve 10 can not rebound under these circumstances, and is still positive at the time instant t4, the current IV flows during the time period between the time instants t4 and t5 through the magnetically operated valve 10, the diode 15, the control capacitor 16 and the measuring resistor 12 to the ground. Commencing with the time instant t4, this current IV becomes gradually smaller until it reaches the value of zero at the time instant t5. After the time instant t5, the direction of flow of the current IV through the magnetically operated valve 10 changes, so that this valve current IV becomes negative, as shown in both FIGS. 2 and 3. This means that now, that is after the time instant t5, the control capacitor 16 drives a current via the control transistor 17 into the magnetically operated valve 10 against the battery voltage UB, due to the capacitor voltage UC available thereat. However, inasmuch as only a limited amount of energy is stored in the capacitor 16, this negative current IV through the magnetically operated valve 10 reaches its maximum value rather quickly, and then the negative current IV diminishes again until it has reached a zero value at the time instant t7. Since, as already mentioned before, the control transistor 17 is switched at the time instant t4 into its conductive state, the voltage UV applied to the magnetically operated valve 10 is switched at this time instant t4 to a high negative value. However, commencing at the time instant t5, this relatively large negative value of the voltage UV diminishes again, that is, moves to higher positive values, until it changes from negative to positive values at the time instant t6. At the time instant t7, the voltage UV applied to the magnetically operated valve 10, as well as the valve current IV, finally reach the values of zero.

It is further to be pointed out that even the relief transistor 13 could be operated in a cyclical manner akin to that described above in conjuction with the operation of the switching transistor 11, during the time period between the time instants t3 and t4. What is important and should be borne in mind in this connection, however, is that the relief transistor 13 must be in its conductive state when the switching transistor 11 is in its non-conductive state. It is equally possible and contemplated by the present invention not to switch the control transistor 17 on, that is into its conductive state, at exactly the time instant t4; rather, it could be switched on somewhat later. However, the last possible time instant for this switch-over of the control transistor 17 into its conductive state is the time instant t5, that is, the time instant of zero passage of the current IV through the magnetically operated valve 10.

The time instants t0 and t4, that is the ground control signal T0 of the magnetically operated valve 10, can be freely chosen by the user of the above-described switching arrangement of the present invention. The time instant t1 can be, for instance, recognized by the control or regulating device 19 on the basis of the measured voltage UM2, in order subsequently to take the measures necessary for the current limitation in the value of the valve current IV. As already mentioned before, the time instant t2 is the time instant of the abutment of the movable part of the magnetically operated valve in its other position. As already alluded to before, the time instant t2 can be determined, in the arrangement operating in accordance with FIG. 2, for example on the basis of the measured voltage UM1 and thus, in the final analysis, on the basis of the sharp bend in the characteristic curve of the flow of the current IV through the magnetically operated valve 10. As also already mentioned above, the time instant t3 is reached when, subsequently to the time instant t2, the value of the valve current IV has reached the value of the threshold holding current IH1 for the first time. The following cycling is then defined by the two threshold holding currents IH1 and IH2.

A particular advantage of the switching arrangement according to the present invention results from the presence of the controlled control capacitor 16 therein. This control capacitor 16 is charged, after the time instant t2, because of the closed or non-conductive states of the transistors 11, 13 and 17, to a relatively high value, depending on its dimensioning. After the charging thereof, that is, during the cycling of the valve current IV, the voltage UC of the capacitor 16 remains constant. After the time instant t4, that is when the movable part of the magnetically operated valve is to be moved rather rapidly back into its initial position, the capacitor 16 causes, due to the high voltage UC present thereat, a relatively rapid decrease in the valve current IV and ultimately a negative current flow through the magnetically operated valve 10. This results in a situation where the movable part of the magnetically operated valve not only falls back into its original position or state, but also is actively switched or moved into this original position. Taken together, it is possible when using the control capacitance 16 to very rapidly return the movable part of the magnetically operated valve 10 into its original position.

In addition to the short switching times, the switching arrangement according to the present invention has the further advantage that the condition of the magnetically operated valve 10 is exactly defined by the two time instants t2 and t4. So, for instance, if the magnetically operated valve 10 is in its closed condition prior to the time instant t0, then at the time instant t2 exactly it has reached its open condition, and shortly after the time instant t4 it has again reached its closed condition. With the aid of these unequivocally defined operating positions, it is then possible to construct a timed regulating circuit.

Finally, the switching arrangement of the present invention offers, especially in comparison with the state of the art, the additonal advantage that only a relatively small energy loss is encountered during the operation thereof, in that the energy of the current extinguishment is fed back into the magnetically operated valve 10 with the aid of the control capacitor 16. In the possible realization of the switching arrangement of the present invention as depicted in FIG. 2, that is with current limitation, the total current loading of the switching arrangements becomes minimum, and even the energy loss increases only insubstantially. The magnetic saturation of the magnetically operated valve is limited in this case, so that the time instant t2 can be recognized with a high degree of security and accuracy.

It will be understood that each of the elements described above, or two or more together, may also find a useful application in other types of arrangements differing from the type described above.

While the invention has been illustrated and described as embodied in a switching arrangement for fuel injection devices of internal combustion engines, it is not intended to be limited to the details shown, since various modifications and structural changes may be made without departing in any way from the spirit of the present invention. More particularly, it is to be mentioned here that the switching arrangement of the present invention is not limited to the circuitry depicted in FIG. 1 of the drawing. It is also possible and contemplated by the present invention to change this circuitry, and the individual components included therein, within the scope of general technical knowledge, or to expand the circuitry to enhance its operation. Yet, such modifications are still embraced within the scope of the invention so long as an important aspect of the present invention, that is the arrangement of the control capacitor in parallel with the switching transistor, is being utilized. Herein, however, the controllable capacitance is not to be understood to be limited to a discrete electrical component; rather, it could also be simulated by or constituted with the aid of electronic or other circuits.

Without further analysis, the foregoing will so fully reveal the gist of the present invention that others can, by applying current knowledge, readily adapt it for various applications without omitting features that, from the standpoint of prior art, fairly constitute essential characteristics of the generic and specific aspects of our contribution to the art and, therefore, such adaptations should and are intended to be comprehended within the meaning and range of equivalence of the claims.

What is claimed as new and desired to be protected by Letters Patent is set forth in the appended claims:

1. A switching arrangement for an electromagnetic load which is interposed between two points one of which is at a predetermined electrical potential difference from the other, comprising switching means arranged in series with the electromagnetic load and operative for selectively enabling and disabling electric current flow in a predetermined direction through the electromagnetic load to energize and deenergize the latter; controllable capacitor means arranged in parallel with said switching means; and means for controlling the operation of at least said capacitor means in such a manner as to be charged to a potential difference exceeding said predetermined potential difference with respect to the other point while the electromagnetic load is energized, and as to discharge during the de-energization of the electromagnetic load with attendant electric current flow from said capacitor means through the electromagnetic load to the one point in a direction opposite to said predetermined direction.

2. The switching arrangement as defined in claim 1, wherein said controlling means includes a diode arranged in series with said capacitor means.

3. The switching arrangement as defined in claim 1, wherein said controlling means inludes additional switching means arranged in series with said capacitor means.

4. The switching arrangement as defined in claim 1, and controlling means includes a diode and additional switching means arranged in series with said capacitor means and in parallel to one another.

5. The switching arrangement as defined in claim 1, said controlling comprising additional switching means and means for operating said switching means and said additional switching means in such a manner that only said switching means is conductive during an initial period of operation of the switching arrangement.

6. The switching arrangement as defined in claim 5, wherein said operating means is operative for rendering said switching means and said additional switching means non-conductive during a second period of operation that follows said initial period.

7. The switching arrangement as defined in claim 6, wherein said operating means is operative for causing said switching means to alternatingly switch between its conductive and nonconductive states during a third period of operation that follows said second period.

8. The switching arrangement as defined in claim 7, wherein said additional switching means includes a switching device arranged in series with said capacitor means; and wherein said operating means is operative for rendering only said switching device conductive during a fourth period of operation that follows said third period.

9. The switching arrangement as defined in claim 8, and further comprising a relief diode for the electromagnetic load, said relief diode being arranged to conduct no current during said second period of operation.

10. The switching arrangement as defined in claim 9, wherein said additional switching means further includes an additional switching device arranged in series with said relief diode and influencing the operation of the latter.

11. The switching arrangement as defined in claim 1, wherein said switching means is operative for at least temporarily limiting the current flowing through the electromagnetic load during an initial period of operation of the switching arrangement.

12. The switching arrangement as defined in claim 11, wherein the current-limiting action of said switching means influences the magnetic saturation of the electromagnetic load; and further comprising means for detecting the end of said initial period of operation on the basis of such current-limiting action.

13. A switching arrangement for an electromagnetic load used in connection with metered delivery of fuel into a combustion chamber of an internal combustion engine and interposed between two points one of which is at a predetermined electrical potential difference from the other, comprising switching means arranged in series with the electromagnetic load and operative for selectively enabling and disabling electric current flow in a predetermined direction through the electromagnetic load to energize and de-energize the latter; controllable capacitor means arranged in parallel with said switching means; and means for controlling the operation of at least said capacitor means in such a manner as to be charged to a potential difference exceeding said predetermined potential difference with respect to the other point while the electromagnetic load is energized, and as to discharge during the de-energization of the electromagnetic load with attendant electric current flow from said capacitor means through the electromagnetic load to the one point in a direction opposite to said predetermined direction.

14. A switching arrangement for a magnetically operated valve used for injecting fuel into a combustion chamber of an internal combustion engine and interposed between two points one of which is at a predetermined electrical potential difference from the other, comprising switching means arranged in series with the magnetically operated valve and operative for selectively enabling and disabling electric current flow in a predetermined direction through the magnetically operated valve to energize and de-energize the latter; controllable capacitor means arranged in parallel with said switching means; and means for controlling the operation of at least said capacitor means in such a manner as to be charged to a potential difference exceeding said predetermined potential difference with respect to the other point while the magnetically operated valve is energized, and as to discharge during the de-energization of the magnetically operated valve with attendant electric current flow from said capacitor means through the magnetically operated valve to the one point in a direction opposite to said predetermined direction.

* * * * *